(12) United States Patent
Hakkola et al.

(10) Patent No.: US 10,090,818 B1
(45) Date of Patent: Oct. 2, 2018

(54) ADAPTIVE SIGNAL COMPRESSOR FOR AM RADIO

(71) Applicant: Silicon Laboratories Inc., Austin, TX (US)

(72) Inventors: Alexander August Arthur Hakkola, Austin, TX (US); Russell Alvin Schultz, Austin, TX (US); Dana John Taipale, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/706,821

(22) Filed: Sep. 18, 2017

(51) Int. Cl.
*H03G 3/30* (2006.01)
*H04R 3/04* (2006.01)
*G10L 25/60* (2013.01)
*H04B 1/16* (2006.01)

(52) U.S. Cl.
CPC ............. *H03G 3/301* (2013.01); *G10L 25/60* (2013.01); *H04B 1/16* (2013.01); *H04R 3/04* (2013.01)

(58) Field of Classification Search
CPC combination set(s) only.
See application file for complete search history.

(56) References Cited

U.S. PATENT DOCUMENTS

| | | | |
|---|---|---|---|
| 6,452,964 B1 * | 9/2002 | Yoshida | H04L 1/0003 370/252 |
| 7,426,376 B2 | 9/2008 | Srinivasan et al. | |
| 7,729,675 B2 | 6/2010 | Krone | |
| 7,890,075 B2 | 2/2011 | Xin et al. | |
| 8,417,206 B2 * | 4/2013 | Allen | H04H 40/81 455/222 |
| 8,559,570 B2 | 10/2013 | Taipale | |
| 8,848,110 B2 | 9/2014 | Khoini-Poorfard et al. | |
| 9,020,165 B2 | 4/2015 | Viegas | |
| 9,172,344 B2 | 10/2015 | Green et al. | |
| 9,178,592 B1 | 11/2015 | Djadi et al. | |
| 2003/0045307 A1 * | 3/2003 | Arviv | H04L 1/20 455/464 |

(Continued)

OTHER PUBLICATIONS

Silicon Laboratories, "High-Performance Automotive AM/FM Radio Receiver and HD Radio(TM)/DAB/DAB+/DMB/DRM Tuner," Si4790x, 2014, 3 pages.

(Continued)

*Primary Examiner* — Junpeng Chen
(74) *Attorney, Agent, or Firm* — Zagorin Cave LLP

(57) ABSTRACT

A receiver includes a compressive factor generator configured to generate a compressive gain signal based on a digital demodulated received signal, a signal quality estimate, an upper modulation level, and a lower modulation level. The receiver includes a gain circuit configured to apply the compressive gain signal to the digital demodulated received signal. The compressive factor generator may include a peak tracking filter configured to generate a peak tracking signal based on the digital demodulated received signal and filter configuration information. The compressive factor generator may include a compression threshold generator configured to generate a modulation index based on the peak tracking signal, the signal quality estimate, the upper modulation level, and the lower modulation level. The compressive factor generator may include a compression curve and a gain compression hold and recovery processor.

20 Claims, 7 Drawing Sheets

(56) References Cited

U.S. PATENT DOCUMENTS

| | | | |
|---|---|---|---|
| 2003/0165157 A1* | 9/2003 | Pollmann | H04L 1/0003 370/465 |
| 2004/0233869 A1* | 11/2004 | Uchida | H04W 28/22 370/329 |
| 2010/0154017 A1* | 6/2010 | An | H04L 12/2801 725/111 |

OTHER PUBLICATIONS

Wikipedia, "Automatic gain control," 2017, 4 pages.

* cited by examiner

ADAPTIVE SIGNAL COMPRESSOR FOR AM RADIO

BACKGROUND

Field of the Invention

The invention relates to communications technology and more particularly to communication using an amplitude modulation (AM) receiver.

Description of the Related Art

Conventional radio receivers include circuitry to adjust signals to have appropriate levels for subsequent circuitry in the signal processing path. Substantial changes in the amplitude of an audio signal (e.g., 10 dB power step) may occur in response to automatic gain control changes in power level. Although the automatic gain control adjusts the signal levels to be in a target amplitude range or a target power range, conventional systems do not have enough headroom in subsequent circuitry to tolerate a 10 dB or greater change in signal power. Such large gain steps may cause popping sounds or other distortion (e.g., distortion due to signal clipping) in an audio signal. Accordingly, improved techniques for receiving audio signals are desired.

SUMMARY OF EMBODIMENTS OF THE INVENTION

In at least one embodiment of the invention, a receiver includes a compressive factor generator configured to generate a compressive gain signal based on a digital demodulated received signal, a signal quality estimate, an upper modulation level, and a lower modulation level. The receiver includes a gain circuit configured to apply the compressive gain signal to the digital demodulated received signal to generate a digital receiver output signal. The compressive factor generator may include a peak tracking filter configured to generate a peak tracking signal based on the digital demodulated received signal, first filter configuration information associated with a first predetermined filter time constant, and second filter configuration information associated with a second predetermined filter time constant. The compressive factor generator may include a compression threshold generator configured to generate a modulation index based on the peak tracking signal, the signal quality estimate, the upper modulation level, and the lower modulation level. The compressive factor generator may include a compression curve configured to generate a second compressive gain signal in response to the modulation index and the digital demodulated received signal. The compressive factor generator may include a gain compression hold and recovery processor configured to generate the compressive gain signal based on the second compressive gain signal, a predetermined gain relaxing constant, and a predetermined constant gain level.

In at least one embodiment of the invention, a method includes generating a compressive gain signal based on a digital demodulated received signal, a signal quality estimate, an upper modulation level, and a lower modulation level. The method includes applying the compressive gain signal to the digital demodulated received signal to generate a digital receiver output signal. Generating the compressive gain signal may include generating a peak tracking signal based on the digital demodulated received signal, first filter configuration information associated with a first predetermined filter time constant, and second filter configuration information associated with a second predetermined filter time constant. Generating the compressive gain signal may include generating a modulation index based on the peak tracking signal, the signal quality estimate, the upper modulation level, and the lower modulation level. Generating the compressive gain signal may include providing a second compressive gain signal in response to the modulation index and the digital demodulated received signal.

In at least one embodiment of the invention, an amplitude modulation (AM) radio receiver includes a receiver front-end configured to demodulate a received radio frequency signal to generate a digital demodulated AM audio signal. The AM radio receiver includes a compressive factor generator configured to generate a compressive gain signal based on the digital demodulated AM audio signal, a corresponding signal-to-noise ratio measurement, a predetermined relaxation constant, and a full-scale gain value. The AM radio receiver includes a multiplier configured to apply the compressive gain signal to the digital demodulated AM audio signal to generate a digital output audio signal. The compressive factor generator may limit a range of gain compression based on a peak value of an absolute value of the digital demodulated AM audio signal, the corresponding signal-to-noise ratio measurement, a first predetermined modulation level, and a second predetermined modulation level, the first predetermined modulation level being greater than the second predetermined modulation level.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
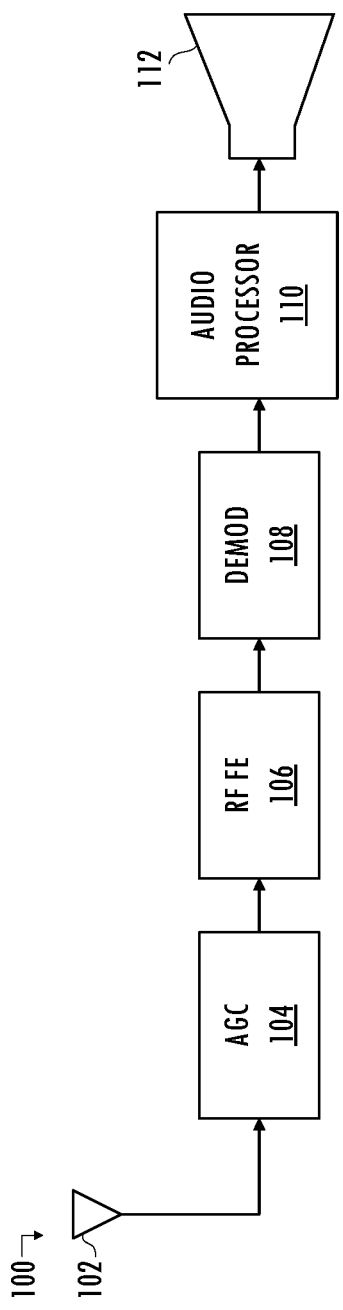
FIG. 1 illustrates a functional block diagram of a conventional digital AM radio.

Referring to FIG. 1, AM receiver 100 receives a radio frequency signal over the air using antenna 102. Automatic gain control (AGC) circuit 104 receives an analog signal from antenna 102 and amplifies or attenuates the analog signal as needed to provide a signal with a suitable signal range (e.g., range that reduces or eliminates clipping or other distortion of the received signal) for subsequent circuitry of AM receiver 100. A gain applied by AGC circuit 104 may amplify or attenuate the analog signal to achieve a target dynamic range. Conventional AGC techniques use an average output signal level or peak output signal level to dynamically adjust the input-to-output gain to a suitable value that equalizes the average volume (e.g., loudness) of different radio stations due to differences in received signal strength, as well as variations in a single signal path due to fading.

Radio frequency front-end 106 may further process the received radio frequency signal using low-noise amplification and filtering techniques to maintain or improve a signal-to-noise ratio of a low-power signal. Demodulator 108 removes the radio frequency carrier signal from a version of the received signal, to provide a baseband (or intermediate frequency) AM signal. A DC filter (not shown) may be included at the output of demodulator 108 to remove or substantially attenuate a DC component of the baseband AM signal. The baseband AM signal may be further processed by audio processor 110 before delivering the resulting signal to speaker 112 or other circuitry. Without AGC 104 the sound emitted by speaker 112 AM radio receiver would vary substantially from a weak signal to a strong signal.

Although the received signal was transmitted compliant with Federal Communications Commission standards (e.g., was broadcast with a maximum sine wave modulation on positive peaks of approximately 125% and a maximum modulation on negative peaks of approximately 100%), reception of a noisy signal by conventional AM receiver 100 may result in harsh pops and clicks from speaker 112. However, AM receiver 100 is unable to distinguish whether such distortion was caused by an AGC step or if the transmitted audio information has changed. In addition, at low signal levels (i.e., under lower signal-to-noise ratio (SNR) conditions), noise is more prevalent and is volatile. Thus, in low SNR conditions, quiet noise (i.e., low output power of the received signal) is preferable to a high output power of the received signal.

Figure 2:
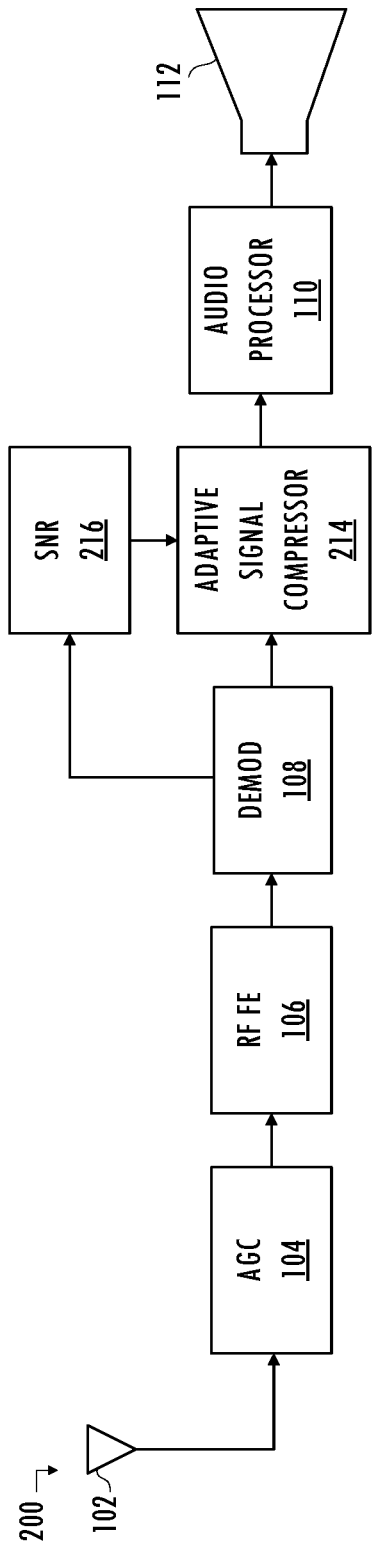
FIG. 2 illustrates a functional block diagram of a digital AM radio including an adaptive signal compressor consistent with at least one embodiment of the invention.

An adaptive gain compression technique uses peak tracking and signal quality estimates (e.g., SNR measurements, ultrasonic noise measurements, relative received signal strength indications, or other suitable signal quality estimates) of the received signal to nonlinearly compress signal gain to improve signal quality. Referring to FIG. 2, receiver 200 has a wide dynamic range and uses gain compression techniques to reduce signal distortion. Gain compression is a reduction in differential or slope gain enabled by a time variation of the transfer function of an amplifying device. Although gain is a linear operation, in general, gain compression is nonlinear. Unlike clipping, which abruptly limits the signal to a predetermined amplitude, thereby distorting the signal and introducing harmonics into the signal, gain compression actively changes the overall gain in response to the level of the input over time, so the transfer function remains linear over a short period of time. In at least one embodiment, adaptive signal compressor 214 is coupled to receive a digital demodulated AM signal from demodulator 108. Adaptive signal compressor 214 applies adaptive gain compression to the digital demodulated AM received signal in response to an SNR measurement of the digital demodulated AM received signal generated by SNR generator 216. SNR generator 216 may generate the SNR measurement using any suitable technique. For example, SNR generator 216 may compute the square of the (root mean square) amplitude ratio of the digital demodulated AM received signal and a premeasured noise signal magnitude and convert that value into a decibel (dB) scale.

Figure 3:
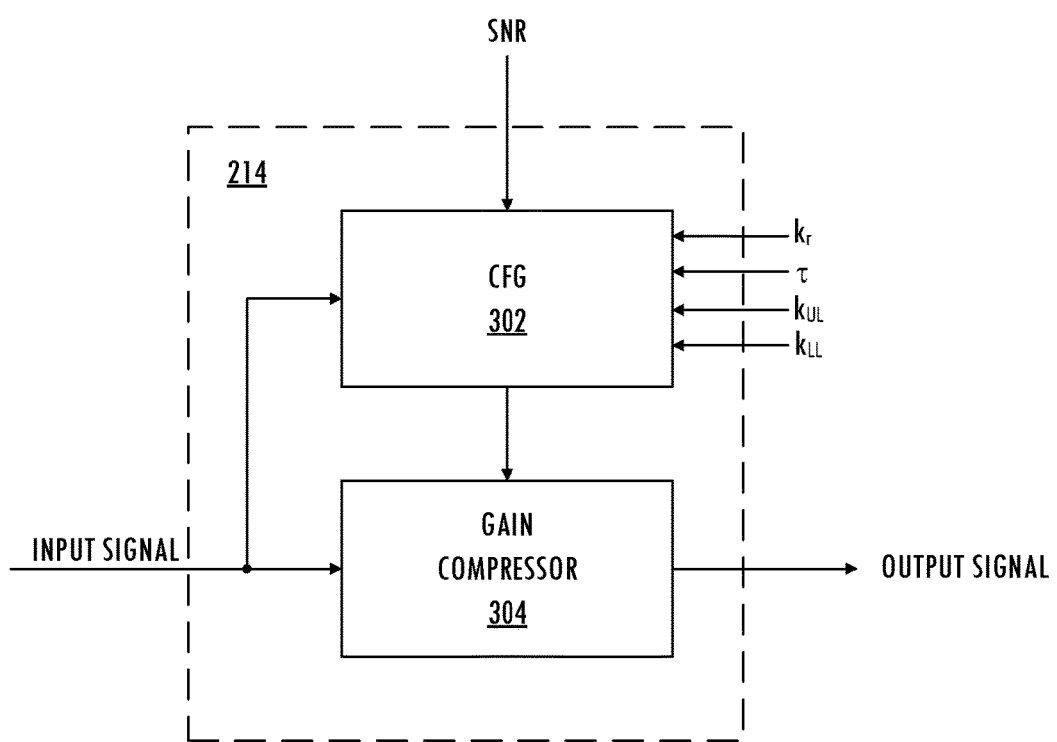
FIG. 3 illustrates a functional block diagram of an adaptive signal compressor consistent with at least one embodiment of the invention.

Referring to FIG. 3, adaptive signal compressor 214 includes compressive factor generator 302 that generates a compressive gain signal based on the SNR measurement, predetermined constants, and the digital demodulated received signal. Gain compressor 304 applies that gain signal to the digital demodulated AM received signal to generate an output signal. The predetermined constants include one or more of a full-scale gain value, an upper modulation level, a lower modulation level, a gain relaxing constant, a scaling factor, or filter configuration information. Those predetermined constants may be determined experimentally or theoretically and may be stored in a memory element integrated with the adaptive signal compressor 214 or in a memory element external to an integrated circuit including adaptive signal compressor 214.

Figure 4:
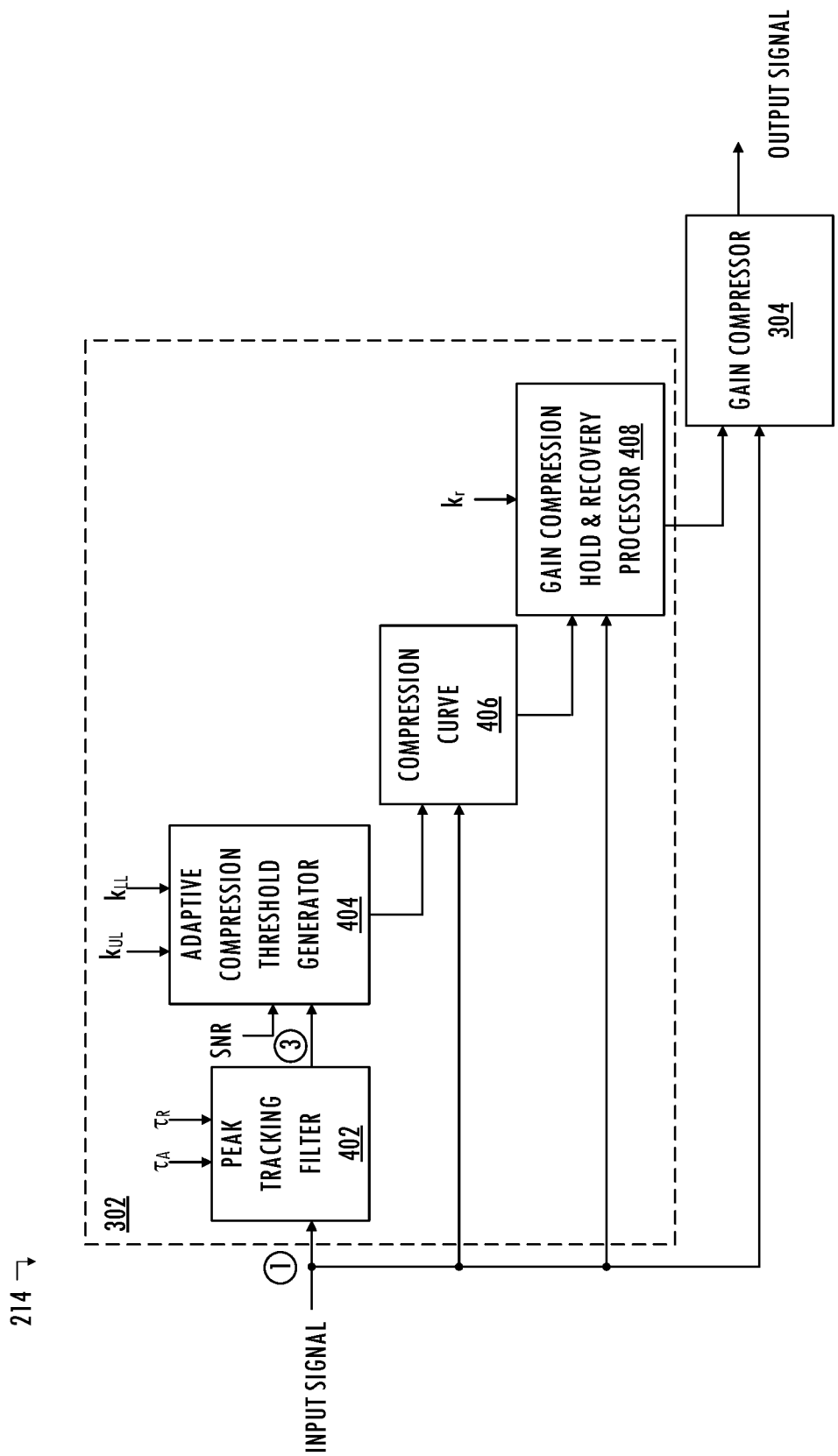
FIG. 4 illustrates a functional block diagram of an exemplary adaptive signal compression consistent with at least one embodiment of the invention.

Referring to FIG. 4, adaptive signal compressor 214 implements gain compression under some circumstances while maintaining a predetermined (e.g., full-scale gain value) under other circumstances. For example, if adaptive signal compressor 214 detects a large power step in the digital demodulated AM received signal and determines that the power step is not a change in the audio signal, adaptive signal compressor 214 compresses the gain to reduce a power step in the output of adaptive signal compressor 214. In at least one embodiment, adaptive signal compressor 214 relaxes the gain compression by holding a gain reduction value for a period of time to cause muting and/or a reduction in the amount of distortion applied to the audio signal (e.g., reducing or eliminating harmonics that may be introduced by the gain compression). Under those circumstances, adaptive signal compressor 214 behaves like a multiplexer selecting between gain compression and muting.

In at least one embodiment of adaptive signal compressor 214, compressive function generator 302 includes peak tracking filter 402, adaptive compression threshold generator 404, compression curve 406, and in some embodiments, gain compression hold and recovery processor 408. Compressive factor generator 302 provides a compressed gain signal to gain compressor 304, which applies the compressed gain to the input signal (e.g., digital demodulated AM received signal). Referring to FIGS. 5-12, in at least one embodiment of adaptive signal compressor 214, peak tracking filter 402 receives an input signal (e.g., a digital demodulated AM received signal) and absolute value function generator 410 provides a corresponding absolute value signal to low-pass filter 412. Low-pass filter 412 outputs a signal having smoother transitions between peaks, which is useful for determining an appropriate dynamic range of the signal. In at least one embodiment, low-pass filter 412 is a dual time constant filter that compares the current filter output to the input absolute value of the audio signal and configures the filter to have a target time constant accordingly (e.g., by changing filter coefficients to select a relatively fast or relatively slow filter time constant) so that the output signal will approximate the peak signal value. For example, if the absolute value of the input signal is greater than the current output of low-pass filter 412, then low-pass filter 412 selects a configuration associated with attack time constant $\tau_A$, which is a faster time constant that release time constant $\tau_R$, so that the filter output can try to meet the filter input. If the absolute value of the input signal is less than the current output of low-pass filter 412, then low-pass filter 412 selects a configuration associated with release time constant $\tau_R$. Low-pass filter 412 provides a peak tracking signal to adaptive compression threshold generator 404. The peak tracking signal approaches a flat signal curve depending on the selected filter time constant. If the peak tracking signal actually approximates the peak signal value, adaptive signal compressor 214 is less likely to compress audio during normal modulation.

Note that the exemplary implementations of compressive function generator 302 represent signed numbers (i.e., positive and negative numbers) using a limited number of bits. In general, the signed numbers are fractional numbers unless otherwise specified. A full-scale gain value refers to the largest positive number that may be represented in fractional notation for the number of bits used in the implementation. Constants applied in the exemplary implementations may vary and/or may be applied differently according to the particular implementation. In at least one embodiment of adaptive compression threshold generator 404, limiter 414 generates a modulation level by adjusting an SNR measurement corresponding to a current sample of the input signal by predetermined constant CONSTANT_8 (e.g., integer value 2 or other value selected according to how the system represents dB values as compared to fractional values that will be compared to the modulation index of the signal). Limiter 414 compares that modulation level to an upper modulation level and to a lower modulation level. Limiter 414 provides the SNR measurement as a first modulation index if the SNR measurement is between the upper modulation level and the lower modulation level. If the SNR measurement is above the upper modulation level, limiter 414 provides the upper modulation level as the first modulation index. If the SNR measurement is below the lower modulation level, limiter 414 provides the lower modulation level as the output modulation index.

If the peak tracking signal provided by peak tracking filter 402 is large and the SNR is high (e.g., approximately at the upper modulation level or above), multiplier 416 provides a relatively high value as a second modulation index. If the peak tracking signal provided by peak tracking filter 402 is large and the SNR is low (e.g., approximately at the lower modulation level or below), multiplier 416 provides a low value as the second modulation index. Exemplary lower and upper modulation level limits are 200% to 800%, respectively. In response to the upper modulation level limit, multiplier 416 and multiplier 418 apply 0 dB gain to the peak tracking signal. Select circuit 420 selects the lesser of the first modulation index (e.g., output of limiter 414) and the second modulation index (e.g., output of multiplier 416 or output of multiplier 418, which multiplies the output of multiplier 416 by predetermined scaling constant CONSTANT_9, e.g., integer value 2 or other value selected according to selected limits on modulation). As a result, select circuit 420 selects the modulation index that provides the quickest reaction and provides that modulation index to compression curve 406 as an indicator of an input level at which to start the gain compression (see FIG. 10).

Adder 424 of compression curve 406 provides select circuit 426 with the difference between the selected threshold input level and the absolute value of the input signal. The difference indicates a threshold of how much gain compression is applied for each input sample. Select circuit 426 compares that difference to zero. If the difference is greater than zero, the select circuit 426 selects that difference as the output and provides a version of that difference to scale converter 432. Otherwise, that input signal has a level below the threshold and select circuit 426 provides zero as the output, causing compression curve 406 to apply no gain compression or a minimum gain compression level to the input signal level. Compression curve 406 converts the input signal to estimate the audio signal power using multiplier 428 and multiplier 430, which applies a predetermined constant CONSTANT_12 (e.g., integer value 2 or other value selected according to the predetermined compression curve). Since perceived loudness of audio signals varies approximately logarithmically with acoustical output power, compression curve 406 scales audio signal power estimate x, e.g., by scale converter 432, which converts the audio signal power estimate x to a logarithmic decibel (dB) scale.

Compression curve 406 generates a difference signal (e.g., using summing node 434) indicating a difference between the audio signal power estimate in dBs and a predetermined power level CONSTANT_1 (e.g., a full-scale power level or a previously computed gain level). In an embodiment of compression curve 406, the output of summing node 434 is a fractional number. In an embodiment of compression curve 406, scale converter 432 negates the sign of the output audio signal power estimate in dBs for computation of a difference signal. However, in other embodiments, compression curve 406 separately negates the output audio signal power estimate in dBs. Compression curve 406 further processes the difference using multipliers 436, 438, and 440 to generate a compression curve output gain value. Multiplier 440 applies predetermined constant CONSTANT_10 (e.g., 2, or other value selected according to the predetermined compression curve) to provide a compressive gain value. Multipliers 436, 438, and 440 implement a predetermined compression curve that may be selected according to output signal preferences (e.g., listening preferences). The compression curve may be tuned under high noise signal conditions to reduce any effects of objectionable noise in the output signal. After selecting the predetermined compression curve, predetermined constants may be adjusted accordingly.

In at least one embodiment, compressive function generator 302 includes gain compression hold and recovery processor 408, which reduces or eliminates harmonic distortion due to the gain relaxing constant. For example, gain compression hold and recovery processor 408 applies a predetermined gain relaxing constant using a holding function (e.g., implemented using a delay element and summer 442) and by selecting (e.g., using select circuit 444) the greater of the compressive gain value and a smoothed or muted version of the compressive gain value to generate an output power reduction level. Gain compression hold and recovery processor 408 generates an output gain value by reducing predetermined constant CONSTANT_11 (e.g., full-scale value) by the output of select circuit 444 using summer 446 to generate an output compressive gain value for application to the input signal by gain compressor 304.

Figure 6:
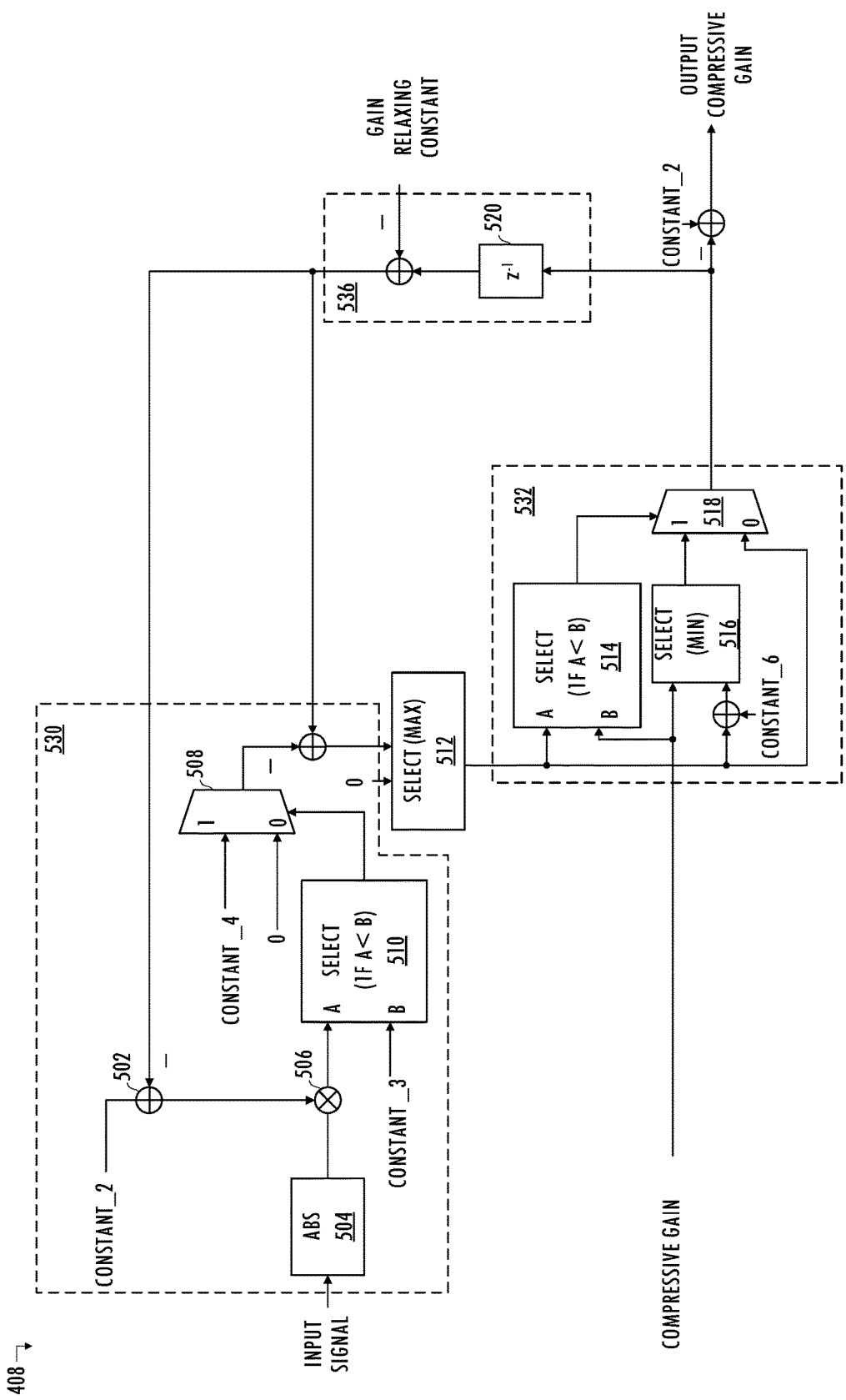
FIG. 6 illustrates a functional block diagram of an alternate embodiment of the gain compression hold and recovery processor of FIG. 5 consistent with at least one embodiment of the invention.
Figure 7:
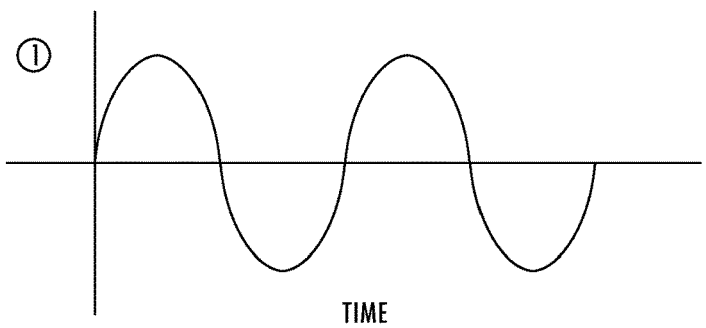
FIG. 7 illustrates a signal waveform for an exemplary digital demodulated received amplitude modulated audio signal.
Figure 8:
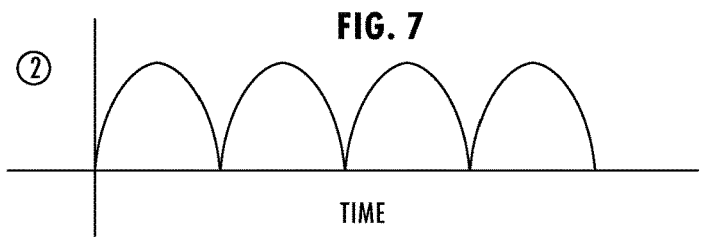
FIG. 8 illustrates an absolute value signal waveform for the exemplary digital demodulated received amplitude modulated audio signal.
Figure 9:
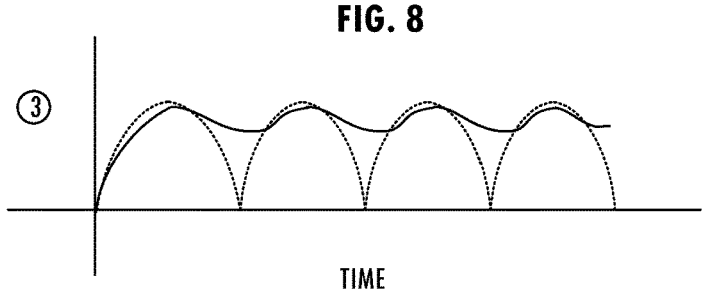
FIG. 9 illustrates signal waveforms for an exemplary peak tracking signal consistent with at least one embodiment of the invention.
Figure 10:
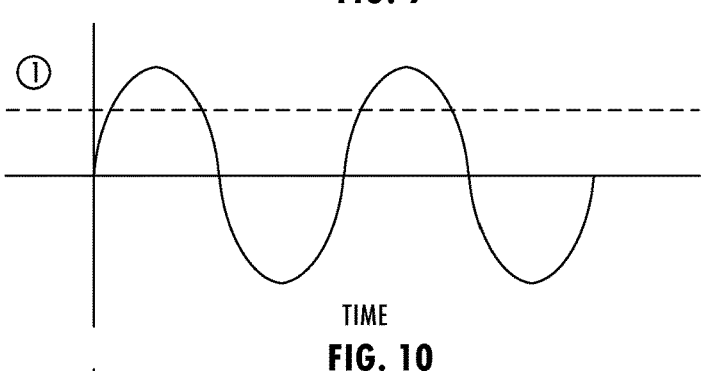
FIG. 10 illustrates a signal waveform and gain threshold for an exemplary digital demodulated received amplitude modulated audio signal consistent with at least one embodiment of the invention.

Referring to FIG. 6, in at least one embodiment, gain compression hold and recovery processor 408 includes fast audio recovery processor 530, gain reduction rate limiter 532, and harmonic distortion reducer 536. Fast audio recovery processor 530 receives the input signal (e.g., a digital demodulated AM received audio signal) and absolute value function generator 504 provides a corresponding absolute value signal, which is scaled by a difference between predetermined constant CONSTANT_2 (e.g., full-scale gain level) and a harmonic distortion adjustment received from harmonic distortion reducer 536. Summing node 502 provides that difference to multiplier 506, which provides the scaled absolute value signal to select signal generator 510. Select signal generator 510 compares the scaled absolute value signal to a predetermined constant CONSTANT_3 (e.g., a 1% to 2% modulation level). If the scaled absolute value signal is below the threshold value provided by predetermined constant CONSTANT_3, then select signal generator 510 provides a control signal to select circuit 508 that selects a predetermined constant CONSTANT_4 (e.g., a value that results in a time constant for complete audio recovery of approximately 5 ms-6 ms when CONSTANT_3 is full-scale). If the scaled absolute value signal is greater than or equal to predetermined constant CONSTANT_3, then select signal generator 510 provides a control signal to select circuit 508 that selects zero for combination with a harmonic distortion reduction level to generate the fast audio recovery output. The output of fast audio recovery processor 530 is a signal that, under some circumstances, reduces low audio level artifacts for faster gain recovery, without reintroducing harmonic distortion that is reduced by harmonic distortion reducer 536 in some operating conditions. Harmonic distortion reducer 536 reduces harmonic distortion of the compression gain value by slowly reducing application of gain compression. Harmonic distortion reducer 536 reduces a delayed version of the output compressive gain (e.g., using delay element 520) by a predetermined gain relaxing constant (e.g., a value that results in a complete audio recovery of approximately 40 ms after a single, isolated complete mute), and provides the difference as a harmonic distortion adjustment to fast audio recovery processor 530. In response to the output of fast audio recovery processor 530 being negative, select circuit 512 limits that output signal to zero, thereby disregarding the output of fast audio recovery processor 530. Otherwise, select circuit 512 provides the output of fast audio recovery processor 530 unchanged to gain reduction rate limiter 532.

Gain reduction rate limiter 532 generates an adjusted compressive gain value based on the compressive gain value generated by compression curve 406, the output of fast audio recovery processor 530, and predetermined constant CONSTANT_6 (e.g., approximately 0.16, which is a maximum linear rate of gain change based on an amount of delay provided by delay element 550 and a maximum change in the signal level). Select circuit 514 compares the output of select circuit 512 to the output of compression curve 406. If the output of compression curve 406 is less than the output of select circuit 512, then select circuit 518 provides a version of the output of select circuit 512 as the compressive gain to apply to the current audio sample. Otherwise, select circuit 518 provides the minimum of a scaled version of the output of select circuit 512 and the output of compressive curve 406 (e.g., the output of select circuit 516) as the output compressive gain. Thus, gain reduction rate limiter 532 limits the rate that the audio compression reacts to artifacts, thereby reducing the risk of the adaptive gain compressor creating an artifact when mitigating another audio artifact.

Figure 5:
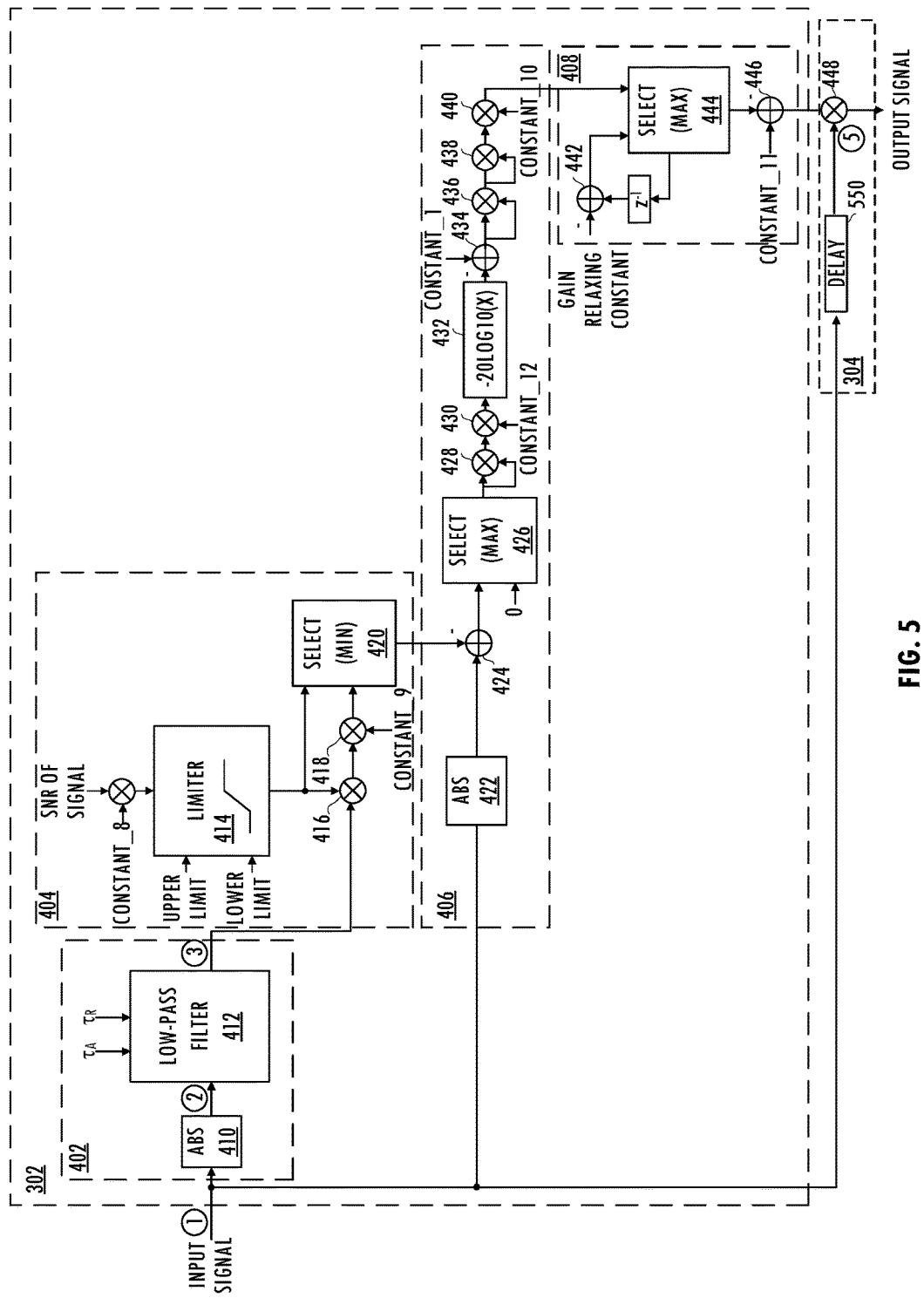
FIG. 5 illustrates a detailed functional block diagram of an exemplary adaptive signal compressor consistent with at least one embodiment of the invention.
Figure 11:
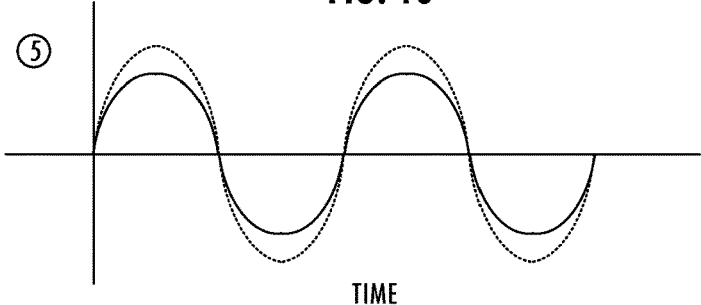
FIG. 11 illustrates waveforms for a digital demodulated received amplitude modulated audio signal and a gain compressed version of the digital demodulated received amplitude modulated audio signal consistent with at least one embodiment of the invention.
Figure 12:
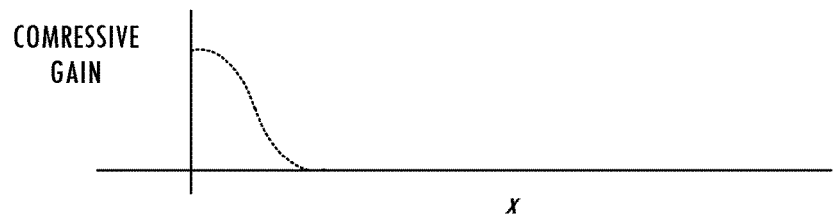
FIG. 12 illustrates a waveform for an exemplary compressive gain function of the adaptive signal compressor of FIG. 4 consistent with at least one embodiment of the invention.

Referring to FIGS. 5 and 11, gain compressor 304 applies the compressed gain signal received from gain compression hold and recovery processor 408 to a delayed version of the input signal using multiplier 448 to generate an output signal. Delay element 550 delays the input signal by a predetermined amount to synchronize the compressed gain value with a corresponding input sample.

Figure 13:
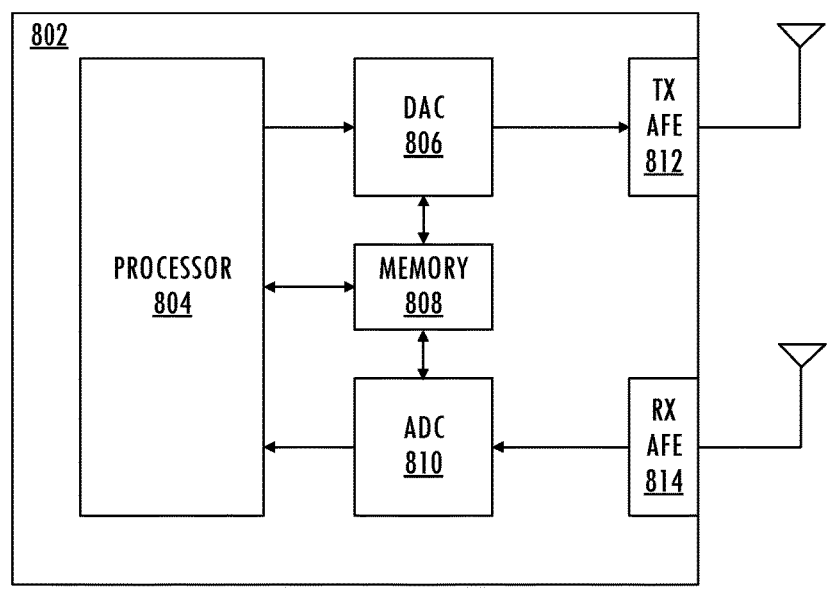
FIG. 13 illustrates a processing system configured to implement adaptive signal compression consistent with at least one embodiment of the invention.

One or more of structures included in adaptive signal compressor 214 may be implemented using software (which includes firmware) executing on a processor or by a combination of software and hardware. Software, as described herein, may be encoded in at least one tangible (i.e., non-transitory) computer-readable medium. As referred to herein, a tangible computer-readable medium includes at least a disk, tape, or other magnetic, optical, or electronic storage medium (e.g., random access memory, read-only-memory). For example, FIG. 13 illustrates radio 802, which includes transmitter analog front end 812 and receiver analog front end 814, each coupled to a respective antenna. Processor 804, which may be a digital signal processor or other processing circuit, implements complex data processing, e.g., filtering and modulation, by executing instructions fetched from memory 808. Custom hardware circuits implement digital-to-analog converter 806, which provides analog data to transmitter analog front end 812 for transmission as electromagnetic signals over the air. Receiver analog front end 814 and associated antenna receive electromagnetic signals over the air and provide the analog signal to custom hardware circuit implementation of analog-to-digital converter 810, which provides digital data to processor 804. Processor 804 implements complex data processing, e.g., demodulation, filtering, or other signal processing, which may include adaptive signal compressor 214 and SNR generator 216 by executing instructions fetched from memory 808.

Thus, techniques for reducing or eliminating distortion in a received signal have been described. The technique reduces the likelihood of compressing gain during normal modulation (e.g., under circumstances where the audio information has changed and the signal is not under the include of an AGC step). The technique reduces the audio harshness of noisy AM reception, reduces the harshness of pops and clicks that are caused by discrete RF gain changes by active antennas for AM reception or other causes, and reduces the audio level for weak signal AM reception.

The description of the invention set forth herein is illustrative, and is not intended to limit the scope of the invention as set forth in the following claims. For example, while the invention has been described in embodiments for audio applications, one of skill in the art will appreciate that the teachings herein can be utilized in other digital communications applications. In addition, while the invention has been described in embodiments using SNR measurements as signal quality estimates, one of skill in the art will appreciate that the teachings herein can be utilized using other signal quality estimate types (e.g., ultrasonic noise measurements, relative received signal strength indications, or other suitable signal quality estimates). Variations and modifications of the embodiments disclosed herein, may be made based on the description set forth herein, without departing from the scope of the invention as set forth in the following claims.

What is claimed is:

1. A receiver comprising:
   a compressive factor generator configured to generate a compressive gain signal based on a digital demodulated received signal, a signal quality estimate, an upper modulation level, and a lower modulation level; and
   a gain circuit configured to apply the compressive gain signal to the digital demodulated received signal to generate a digital receiver output signal.

2. The receiver, as recited in claim 1, wherein the compressive factor generator comprises:
   a peak tracking filter configured to generate a peak tracking signal based on the digital demodulated received signal, first filter configuration information associated with a first predetermined filter time constant, and second filter configuration information associated with a second predetermined filter time constant;
   a compression threshold generator configured to generate a modulation index based on the peak tracking signal, the signal quality estimate, the upper modulation level, and the lower modulation level; and
   a compression curve configured to generate a second compressive gain signal in response to the modulation index and the digital demodulated received signal.

3. The receiver, as recited in claim 2, wherein the peak tracking filter comprises:
   an absolute value filter configured to provide an absolute value of the digital demodulated received signal in response to the digital demodulated received signal; and
   a low-pass filter configured to provide the peak tracking signal based on the absolute value of the digital demodulated received signal, the first filter configuration information, and the second filter configuration information.

4. The receiver, as recited in claim 3, wherein the compression threshold generator comprises:
   a limiter configured to generate a first modulation index based on the signal quality estimate, the upper modulation level, and the lower modulation level; and
   a selector configured to provide as the modulation index a lesser of a scaled version of the peak tracking signal and the first modulation index.

5. The receiver, as recited in claim 2, wherein the compression curve comprises
   an absolute value filter configured to provide an absolute value of the digital demodulated received signal based on the digital demodulated received signal;
   a combiner configured to output a compression curve index based on a difference between the modulation index and an absolute value of the digital demodulated received signal; and
   a selector configured to provide as an output compression curve index, a greater of zero and the compression curve index.

6. The receiver, as recited in claim 2, wherein the compressive factor generator further comprises:
   a gain compression hold and recovery processor configured to generate the compressive gain signal based on the second compressive gain signal, a predetermined gain relaxing constant, and a predetermined constant gain level.

7. The receiver, as recited in claim 6, wherein the gain compression hold and recovery processor reduces the predetermined constant gain level by a greater of the second compressive gain signal and a low-pass filtered relaxed compressive gain signal to generate the compressive gain signal.

8. The receiver, as recited in claim 1, wherein the receiver comprises:
   a processor; and
   software stored in a storage element coupled to the processor, the software being executable by the processor to implement the compressive factor generator.

9. The receiver, as recited in claim 1, wherein the compressive factor generator generates a first sample of the compressive gain signal based on a first sample of the digital demodulated received signal, the signal quality estimate, and a predetermined constant gain level and generates a subsequent sample of the compressive gain signal based on a subsequent sample of the digital demodulated received signal, a subsequent signal quality estimate, and the predetermined constant gain level.

10. The receiver, as recited in claim 1, wherein the compressive factor generator limits a range of gain compression based on a peak value of an absolute value of the digital demodulated received signal, the signal quality estimate, the upper modulation level, and the lower modulation level, the upper modulation level being greater than the lower modulation level.

11. A method comprising:
    generating a compressive gain signal based on a digital demodulated received signal, a signal quality estimate, an upper modulation level, and a lower modulation level; and
    applying the compressive gain signal to the digital demodulated received signal to generate a digital receiver output signal.

12. The method, as recited in claim 11, wherein generating the compressive gain signal comprises:
    generating a peak tracking signal based on the peak tracking signal, first filter configuration information associated with a first predetermined filter time constant, and second filter configuration information associated with a second predetermined filter time constant;
    generating a modulation index based on the digital demodulated received signal, the signal quality estimate, the upper modulation level, and the lower modulation level; and
    providing a second compressive gain signal in response to the modulation index and the digital demodulated received signal.

13. The method, as recited in claim 12, wherein generating the peak tracking signal comprises:
    generating an absolute value of the digital demodulated received signal in response to the digital demodulated received signal; and
    low-pass filtering the peak tracking signal based on one of the first filter configuration information and the second filter configuration information.

14. The method, as recited in claim 13, wherein generating the modulation index further comprises:
    scaling the peak tracking signal with the modulation index to generate a scaled version of the peak tracking signal; and
    selecting a lesser of the scaled version of the peak tracking signal and a second modulation index as the modulation index.

15. The method, as recited in claim 12, wherein generating the second compressive gain signal comprises:

generating a compressive curve index based on a difference between an absolute value of the digital demodulated received signal and the modulation index; and selecting as a second compression curve index, a greater of zero and the compressive curve index.

16. The method, as recited in claim 12, wherein the compressive gain signal is further based on a first gain compression value, a predetermined gain relaxing constant, and a predetermined constant gain level.

17. The method, as recited in claim 12, wherein generating the compressive gain signal comprises:

relaxing the second compressive gain signal using a predetermined gain relaxing constant; and applying a greater of the second compressive gain signal and a low-pass filtered relaxed compressive gain signal to generate the compressive gain signal.

18. The method, as recited in claim 17, wherein the applying includes reducing a predetermined gain value by the greater of the second compressive gain signal and a low-pass filtered relaxed compressive gain signal to generate the compressive gain signal.

19. An amplitude modulation (AM) radio receiver comprising:

a receiver front-end configured to demodulate a received radio frequency signal to generate a digital demodulated AM audio signal;

a compressive factor generator configured to generate a compressive gain signal based on the digital demodulated AM audio signal, a corresponding signal-to-noise ratio measurement, a predetermined relaxation constant, and a full-scale gain value; and a multiplier configured to apply the compressive gain signal to the digital demodulated AM audio signal to generate a digital output audio signal.

20. The AM radio receiver, as recited in claim 19, wherein the compressive factor generator limits a range of gain compression based on a peak value of an absolute value of the digital demodulated AM audio signal, the corresponding signal-to-noise ratio measurement, a first predetermined modulation level, and a second predetermined modulation level, the first predetermined modulation level being greater than the second predetermined modulation level.

* * * * *

UNITED STATES PATENT AND TRADEMARK OFFICE
CERTIFICATE OF CORRECTION

PATENT NO.        : 10,090,818 B1
APPLICATION NO.   : 15/706821
DATED             : October 2, 2018
INVENTOR(S)       : Alexander August Arthur Hakkola et al.

Page 1 of 1

It is certified that error appears in the above-identified patent and that said Letters Patent is hereby corrected as shown below:

In the Claims

In Column 9, Line 36, please replace "3" with --2--;
    Line 45, please insert --:-- after "comprises";

In Column 10, Line 4, please insert --further-- after "wherein the receiver";
    Lines 36 and 37, please replace "peak tracking" with --digital demodulated received--;
    Lines 41 and 42, please replace "digital demodulated received" with --peak tracking--;
    Line 53, please replace "peak tracking" with --absolute value of the digital demodulated received--; and
    Line 56, please replace "13" with --12--.

Signed and Sealed this
Fourth Day of December, 2018

Andrei Iancu
*Director of the United States Patent and Trademark Office*